United States Patent
Ooi et al.

(10) Patent No.: US 7,485,892 B2
(45) Date of Patent: Feb. 3, 2009

(54) OPTICAL BROADBAND EMITTERS AND METHODS OF MAKING THE SAME

(75) Inventors: Boon-Siew Ooi, Orefield, PA (US); Hery Susanto Djie, Bethlehem, PA (US); Yan Zhou, Pleasanton, CA (US); Scott A. Meyer, Livermore, CA (US)

(73) Assignees: Carl Zeiss Meditec Inc., Dublin, CA (US); Lehigh University, Bethlehem, PA (US)

( * ) Notice: Subject to any disclaimer, the term of this patent is extended or adjusted under 35 U.S.C. 154(b) by 151 days.

(21) Appl. No.: 11/322,814

(22) Filed: Dec. 29, 2005

(65) Prior Publication Data
US 2007/0152225 A1 Jul. 5, 2007

(51) Int. Cl.
*H01L 29/06* (2006.01)
(52) U.S. Cl. .............................. 257/14; 257/17; 372/23; 372/45.01; 372/46.01
(58) Field of Classification Search .................... 257/14, 257/17; 372/23, 45, 46
See application file for complete search history.

(56) References Cited

U.S. PATENT DOCUMENTS

| | | | |
|---|---|---|---|
| 5,252,839 A | 10/1993 | Fouquet | |
| 6,027,989 A | 2/2000 | Poole et al. | |
| 6,148,012 A * | 11/2000 | Capasso et al. | 372/45.012 |
| 6,570,659 B2 | 5/2003 | Schmitt | |
| 6,617,188 B2 | 9/2003 | Ooi et al. | |
| 7,062,114 B2 * | 6/2006 | Webjorn et al. | 385/14 |
| 7,082,253 B2 * | 7/2006 | Dominic et al. | 385/147 |
| 7,113,667 B2 * | 9/2006 | Welch et al. | 385/24 |
| 2005/0161685 A1 | 7/2005 | Valez et al. | |
| 2005/0265403 A1 * | 12/2005 | Anderson et al. | 372/20 |
| 2007/0183738 A1 * | 8/2007 | Welch et al. | 385/147 |

FOREIGN PATENT DOCUMENTS

| | | |
|---|---|---|
| WO | WO-167497 | 9/2001 |
| WO | WO-0235589 A1 | 5/2002 |

OTHER PUBLICATIONS

Charbonneau, S., et al., "Bandgap tuning of InGaAs/InGaAsP/InP laser using high energy ion implantation", *Applied Physics Letters*, 67(20), (Nov. 13, 1995), 2954-2956.

Chi, J J., et al., "Spatially selective modification of GaAs/AlGaAs quantum wells by $SiO_2$ capping and rapid thermal annealing", *Applied Physics Letters*, 55(9), (Aug. 28, 1989), 855-857.

(Continued)

*Primary Examiner*—Fernando L Toledo
(74) *Attorney, Agent, or Firm*—Schwegman, Lundberg & Woessner, P.A.

(57) ABSTRACT

An optical broadband emitter and the method of making such a broadband emitter are described. Intermixing of closely coupled multiple quantum wells, especially carrier tunneled coupled quantum wells, is described using nano-imprinting of a gel like dielectric layer such as a sol-gel derived $SiO_2$ layer into multiple stepped or graded sections to form intermixing cap regions of different thickness. A thermal annealing process is performed to condense the $SiO_2$ intermixing cap and induce intermixing. A superluminescent diode is described having multiple electrodes deposited over multiple sections of different bandgaps in which each individual electrode can be either forward or reverse biased to different degrees such that each diode section can individually function as a sub-band spontaneous emitter, an amplifier/attenuator, a photon-absorber, a transparent waveguide, or a photodetector/optical power monitor.

11 Claims, 13 Drawing Sheets

OTHER PUBLICATIONS

Djie, H S., et al., "Analysis of strain-induced polarisation insensitive integrated-waveguides fabricated using ion implantation-induced intermixing", *J. Optoelectron* (special issue), 149(4), (Aug. 4, 2002),138-144.

Fercher, A F., et al., "Optical coherence tomography principles and applications", *Reports on Progress in Physics*, 66, Section 2.6.2, (Jan. 20, 2003),239-303.

Gunawan, O , et al., "Electronics states of interdiffused quantum dots", *Physical Review Letters*, 71, (May 27, 2005),205-319.

Hitzenberger, C K., et al., "Measurement of corneal thickness by low-coherence interferometry", *Applied Optics*, 31, (1992),6637-6642.

Leitgeb, R A., et al., "Performance of fourier domain vs. time domain optical coherence tomography", *Optics Express* 11(8), (Apr. 21, 2003),889-894.

Lim, H S., et al., "A novel fabrication technique for multiple-wavelength photonic-integrated devices in InGaAs-InGaAsP laser heterostructures", *IEEE Photonics Technology Letters*, 14(5), (2002),594-596.

Ooi, Boon-Siew , et al., "Fabrication of Multiple Wavelength Lasers in GaAs-AlGaAs Structures using a One-Step Spatially Controlled Quantum-Well Intermixing Technique", *IEEE Photonics Technology Letters*, 7(9), (Sep. 1995),944-96.

Ooi, Boon-Siew , et al., "Selective quantum well intermixing in GaAs/AlGaAs structures using impurity-free vacancy diffusion", *IEEE Journal of Quantum Electron*, 33, (Oct. 1997),1784-1793.

\* cited by examiner

OPTICAL BROADBAND EMITTERS AND METHODS OF MAKING THE SAME

FIELD OF THE INVENTION

The present invention relates to optical emitters and, more particularly, to broadband emitters and methods of making broadband emitters.

BACKGROUND INFORMATION

The sensitivity, signal quality, and the axial spatial resolution of current bio-imaging and probing systems using Optical Coherence Tomography (OCT) technology are primarily limited by the power and the bandwidth of the broadband light source. With recent advances in solid state and various optically and electrically driven light emitter technologies, there are no substantial shortages for light sources in the visible, near-mid-far infrared spectra. However, the development of a Gaussian spectrum and spectrally flat optical output light source that spans across a wide spectrum range remains a great challenge.

Generally, broadband light sources used in the current OCT system are obtained from four main sources: incandescent/halogen light sources, optically pumped crystal lasers, such as Ar-ion pumped Ti:$Al_2O_3$ laser, optically pumped fiber based amplified spontaneous emission (ASE) source, and semiconductor superluminescent diodes (SLDs).

Although incandescent/halogen light sources have broad bandwidths, they do not have sufficient intensity in a single spatial mode for high-speed imaging. Furthermore, the source exhibits major drawbacks, such as instability, poor reliability, and low energy efficiency. Typically, optically pumped crystal lasers utilizes non-linear optical or optical parametric effects to generate a broad band light. Although ultra short pulse laser sources have very broad spectral bandwidths (up to 350 nm) and high single-mode power, however the spectrum profile is not perfectly Gaussian and is limited to the emission in the near-infrared region (centered at ~800 nm).

Optically pumped fiber lasers produce ultra broad non-Gaussian spectral bandwidths, but such operation requires a high power laser for optical pumping and an optical filter to produce a Gaussian spectrum. Moreover, the majority of these sources are expensive, bulky as most of them are table top systems, and consume very high power as the energy efficiency is low, thus presenting a major challenge to the widespread adoption of ultra high resolution OCT imaging technology in the clinical setting.

Semiconductor SLDs are particularly attractive for many imaging and sensor system applications due to their compactness and low energy requirement. The axial resolutions from available SLDs are typically limited to 10-15 μm for a device with a bandwidth of 20-30 nm at the center wavelength of 800 nm. Although not economic, techniques such as the combination of two or more SLDs with dissimilar wavelengths have been used to broaden the spectrum width, hence improving the axial spatial resolution of the OCT system to about 1 μm in scattering tissue and the retina. Different approaches have been used to further decrease the coherence length by broadening the spectral width of the SLDs.

Quantum-wells with different thicknesses and/or compositions in an active region have been used to expand luminescence spectrums. Due to the combination effects of different quantum-well carrier capture rates, low luminescence efficiency caused by the inter-well tunneling and photon re-absorption, SLDs fabricated using this technique usually give non-spectrally-flat optical output and low emission efficiency. In addition, the spectrum width is limited to the number of asymmetric quantum-wells that are used.

Broad luminescence width can be achieved by changing the quantum-well bandgap energy using selective area epitaxy or shadow masked growth. These techniques require extremely complex process optimization and design. The spectrum width of the SLDs using these processes is very much limited to 85 nm for most semiconductor structures.

Prior art lattice interdiffusion, or intermixing, or disordering processes are based on the fact that a quantum well (QW) system is inherently a meta-stable system due to the large concentration gradient of atomic species across the QWs and barriers interface. The process involves the introduction of beneficial defects to the material. During thermal annealing, the introduced impurities or created point defects alter the Fermi level and the high temperature enhances the solubility of certain point defects, which result in an increase in atomic interdiffusion rate and promote intermixing. It results in an increase of the bandgap energy when the energy profile changes from abrupt to graded QW bandgap profiles.

Although intermixing techniques have shown significant advantages over methods involving several growth and regrowth steps or spatially selective epitaxial growth for the bandgap engineering process, the spatial control of the degree of bandgap energy shift across a wafer using the existing quantum-well intermixing (QWI) techniques is indirect and complicated. For example, the spatial control of the bandgap across a GaAs/AlGaAs QW structure based on the sequential use of $SiO_2$ masks with different thicknesses as QWI sources for impurity free vacancy diffusion (IFVD) or as implant mask for impurity induced disordering (IID) usually leads to a multiplication of the number of lithography, etching and dielectric cap deposition steps.

To address this issue, a one-step spatially controlled QWI technique based on IFVD was previously proposed. In this process, the semiconductor is patterned with very small areas of $SrF_2$ followed by coating the sample with $SiO_2$. The $SrF_2$ patterns act as the bandgap control mask, while the $SiO_2$ layer acts as an intermixing source. The degree of intermixing is then found to depend on the area of semiconductor surface in direct contact with the $SiO_2$ layer. Although this technique is a one-step process, it requires complex process design including e-beam lithography and lift-off process to obtain the desired features for the implant mask.

Using the IID technique, selective area intermixing across a wafer can also be obtained with variable thickness $SiO_2$ implant mask. However, this technique involves multiple lithography and etching steps. This can add significant process complexity, therefore illustrating the need for development of a simpler, single-mask processes to obtain the multiple bandgap QWI. In addition, this process needs to be performed at high implantation energy of ~1 MeV, which results in the formation of extended defects such as vacancy clusters in the material and makes the complete recovery of the material damage a challenging task.

Based on similar process principles to the variable thickness of $SiO_2$ implant mask, a significantly improved technique to achieve multiple bandgaps or graded bandgap across an InGaAs-InGaAsP laser structure was developed using a one process step technique. This process utilized grey scale mask lithography and near surface low-energy IID techniques to control surface point defect density, which in turn, spatially control the bandgap across an InGaAs/InGaAsP laser chip. In brief, spatial control of a $SiO_2$ mask thickness is achieved by using a grey mask lithography technique followed by a one-step reactive-ion etching (RIE) process.

Although the grey mask low-energy IID is a simple process, and requires only a one-step lithography and intermixing step to create multiple bandgaps across a QW wafer, this technique is an expensive approach and requires a precise control of the $SiO_2$ implant mask thickness. Furthermore, the critical process is to obtain a precise iso etch rate pattern transfer capability with precise control using RIE process.

Versatile intermixing has to be complemented with a robust material system to potentially offer large bandgap tunability. Due to the finite band offset of the material, most of the intermixing processes developed in material systems such as GaAs/AlGaAs and InGaAs/InGaAsP produce relatively narrow wavelength tunability. In an InGaAs/InGaAsP laser structures for example, a differential bandgap shift of only up to about 100 meV between the intermixed and non-intermixed regions can typically be obtained.

Most of the existing prior art post-growth multiple-bandgap engineering technologies require complex sample preparation and process steps. Also, the bandgap tuning range of these processes is relatively narrow.

DETAILED DESCRIPTION

Figure 1:
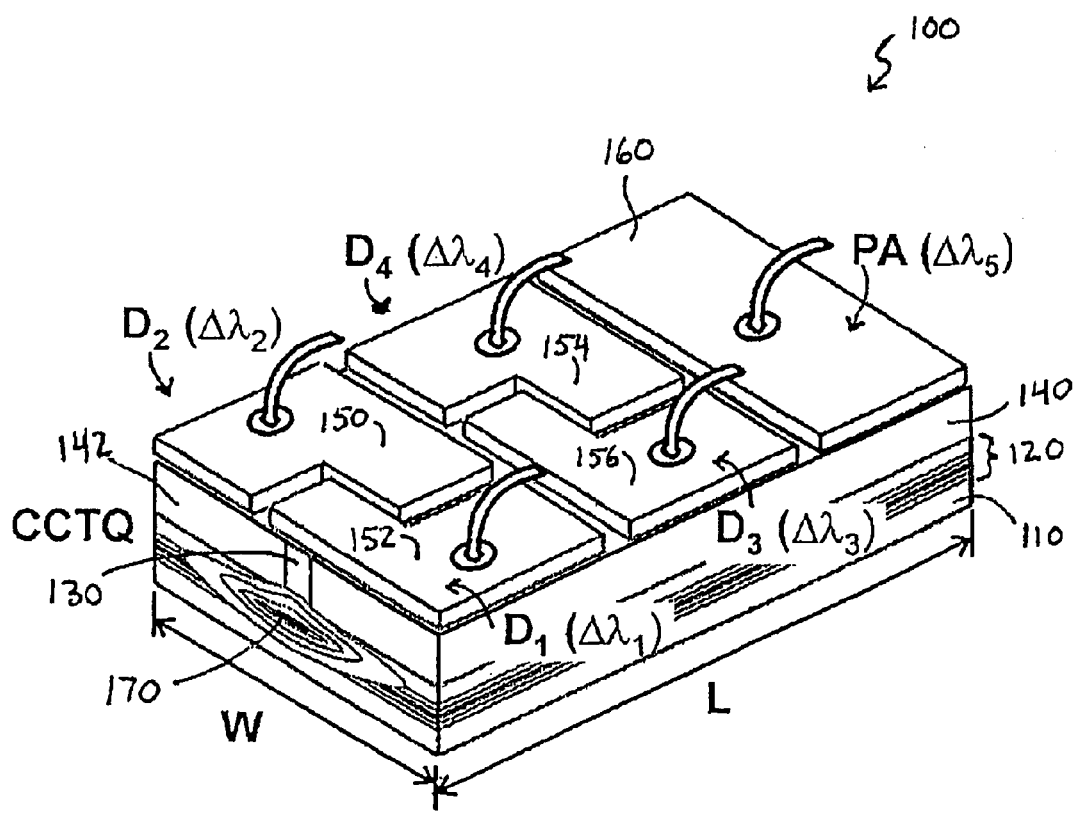
FIG. 1 is a cross-section of a semiconductor emitter of an embodiment of the present invention.

In the following detailed description, reference is made to the accompanying drawings, which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface onto which a layer is deposited according to the present invention, for example to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures. The term conductor is understood to include semiconductors, and the term insulator is defined to include any material that is less electrically conductive than the materials referred to as conductors.

Embodiments of the invention disclose a new method to fabricate broad bandwidth and power reconfigurable semiconductor light sources. In some embodiments a spectrum width can potentially span over hundreds of nanometers. Embodiments may produce micrometer scale axial resolution, and boost the signal-to-noise ratio of an Optical Coherence Tomography (OCT) system substantially.

In terms of device structure, previous SLDs either have only one light emission section, or two sections with one section acting as the emission section and the other acting as a photon absorption section to suppress lasing (see for example, U.S. Pat. No. 5,252,839 and U.S. Published Application 20050161685), these devices emit light with a more or less fixed spectral shape which is not reconfigurable.

In embodiments of the present invention, a spectrally reconfigurable superluminescent diode made from closely coupled multiple quantum wells, especially carrier tunneled coupled quantum wells is described having multiple electrodes deposited over multiple sections of different bandgaps in which each individual electrode can be either forward or reverse biased to different degrees. Nano-imprinting of a gel-like dielectric layer into multiple stepped or graded sections is employed to form intermixing cap regions of different thickness and thermal annealing is carried out to induce intermixing.

A semi-conductor device is described below that provides an edge emitting light source that can be 'tuned'. Specifically, the light source uses a quantum well structure to emit photons from an edge, or facet, of a semiconductor die. The quantum well structure is fabricated so that different areas of the quantum well have different degree of intermixing and thus different energy levels during operation. Electrodes are fabricated to selectively activate one or more of the different energy areas of the quantum well.

FIG. 1 illustrates a simplified perspective view of a portion of a semi-conductor broadband emitter 100 of an embodiment of the present invention. The emitter comprises a series of laterally spaced emitting diodes having different bandgap energy levels. In general, an intrinsic region 120 is sandwiched between an n-doped substrate 110 and a p-doped region 130. As such a p-i-n diode structure is defined in the vertical direction of the emitter structure. The p-doped region is patterned into a ridge to form a light wave guide, as explained below. It will be appreciated by those skilled in the art that with the benefit of the present description, the doping regions can be changed and are not limited to the illustrated configuration.

A series of conductive electrodes 150, 152, 154, 154 and 160 are fabricated above the p-doped region and laterally spaced along the length of the p-doped region 130. The conductive electrodes can be fabricated from suitable material including, but not limited to, metal, metal alloy or semi-conductive material. In operation, the electrodes can be selectively biased to control photon emission from the intrinsic region 120 at an edge location 170 below the p-doped layer 130. That is, each individual electrode can be either forward or reverse biased to different degrees such that each diode section can individually function as a sub-band spontaneous emitter, an amplifier or attenuator, a photon-absorber, a transparent waveguide, or a photodetector-optical power monitor. It will be appreciated by those skilled in the art that the illustrated structure of FIG. 1 is simplified for purposes of explanation and that additional structures and components may be provided in different embodiments.

The intrinsic region is fabricated as a closely coupled quantum well structure. In one embodiment, the closely coupled multiple quantum well, such as a "carrier tunneled coupled quantum-well" (CTCQ) structure, is used to achieve broad luminescence characteristic of the diode device.

Due to the inherent drawback of multiwidth QW structures, embodiments of the invention provide a diode device which reduces strong inter-well tunneling and photon re-absorption, thus producing a smooth Gaussian shape of spectra. A special closely coupled multiple quantum well structure, the carrier tunneled coupled quantum-well active layer structure is described herein to further enhance the luminescent width of the diode device while minimizing the inherent drawback from the multiwidth asymmetric quantum well structures.

In one embodiment a small bandgap quantum-well (QW) is coupled to, or sandwiched between, two slightly larger gap quantum-well(s) to expand the luminescent bandwidth and to improve the carrier injection. The bandgap difference between the small and large bandgap quantum-wells can be limited to about $\leq 20$ meV to reduce issues associated with the conventional semiconductor superluminescent diodes (SLDs) fabricated using an asymmetric quantum-well approach. These issues include, for example, unequal carrier capture rates, inter-well tunneling and photon re-absorption; which would result in non-spectrally-flat optical output, and low luminescent efficiency. Embodiments of the present invention can also increase the luminescent efficiency of the device by improving the carrier collection. The present invention provides for the application of "closely coupled quantum-well" active media in a semiconductor broadband light source.

Figure 2:
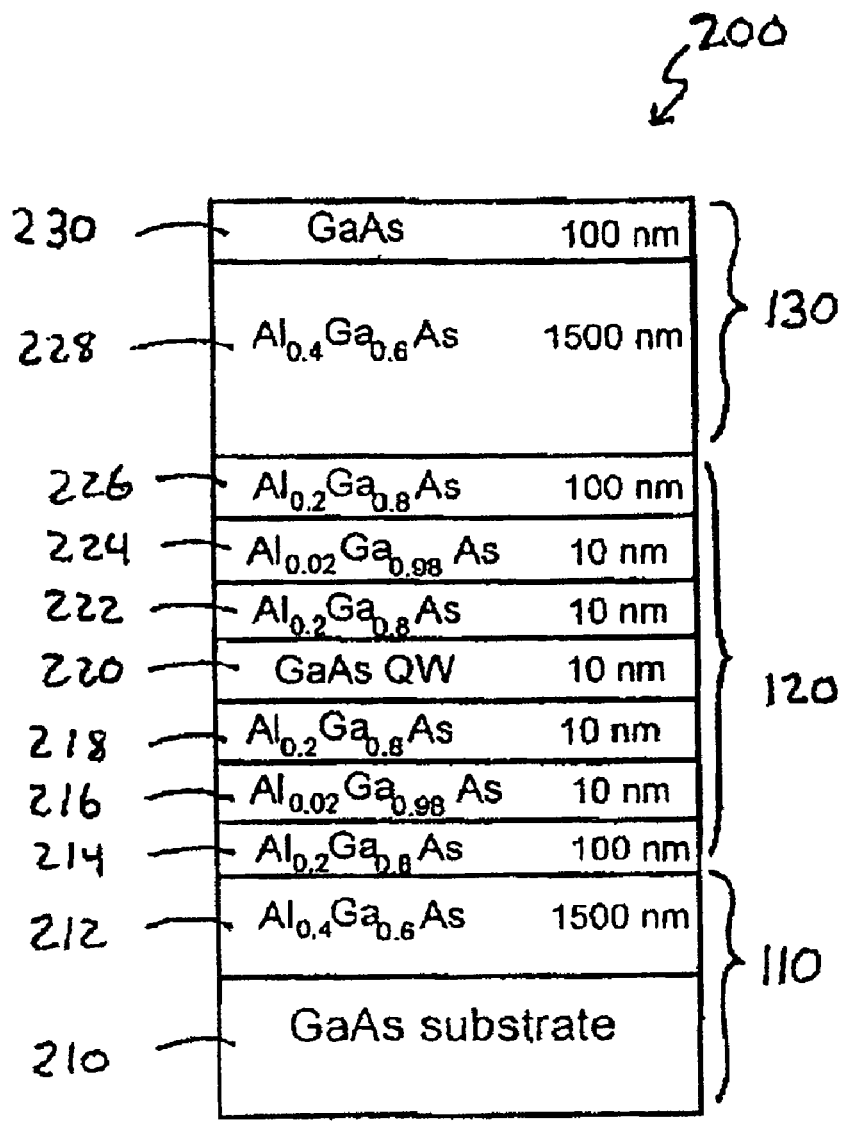
FIG. 2 illustrates a simplified cross-section of an active region according to an embodiment of the present invention.

Referring to FIG. 2, a simplified cross section of a semiconductor structure 200 of an embodiment of the semiconductor of FIG. 1 is described. The structure is formed on a GaAs substrate 210. The substrate can function as at least a portion of the n-doped region 110 of FIG. 1. Multiple layers 212-230 of GaAs comprising materials are vertically layered over the substrate. The material and approximate thicknesses of layers 212-230 are:

Layer 212 is $Al_{0.4}Ga_{0.6}As$ 1500 nm thick;
Layer 214 is $Al_{0.2}Ga_{0.8}As$ 100 nm thick;
Layer 216 is $Al_{0.02}Ga_{0.98}As$ 10 nm thick;
Layer 218 is $Al_{0.2}Ga_{0.8}As$ 10 nm thick;
Layer 220 is GaAs 10 nm thick;
Layer 222 is $Al_{0.2}Ga_{0.8}As$ 10 nm thick;
Layer 224 is $Al_{0.02}Ga_{0.98}As$ 10 nm thick;
Layer 226 is $Al_{0.2}Ga_{0.8}As$ 100 nm thick;
Layer 228 is $Al_{0.4}Ga_{0.6}As$ 1500 nm thick; and
Layer 230 is GaAs 100 nm thick.

Layers 228 and 230 can be patterned and doped to form the p-doped region 130 of FIG. 1. As such, layers 216 to 226 operate as a carrier tunneled coupled quantum-well (CTCQ) active area. When a bias (forward or reverse) is provided between the substrate 210 and the upper GaAs layer 230, photons can be emitted from multiple quantum wells. Specifically a small energy bandgap quantum well is formed in layer 220. Larger energy bandgap quantum wells are formed above and below the small quantum well in layers 224 and 216, respectively.

Embodiments of the invention provide a quantum-well(s) with a small bandgap energy coupled to a slightly larger bandgap quantum-well, or alternatively sandwiched between two slightly larger bandgap quantum-wells to form an active core region of an emitter. The bandgap difference between these two quantum-wells can be limited to about $\leq 20$ meV to avoid photon re-absorption. The thickness of barriers between the small and large bandgap QWs, or simply called barrier layers, can be less than or about equal to the electron wavelength, i.e., $\leq 10$ nm, to allow carriers to tunnel from the large gap QWs to the small gap QWs. Upon small or low current injection, electrons in the large gap QW 216 or 224 tunnel through the thin barrier 218 or 222, and are collected in the small gap QW 220.

Electroluminescence at low injection is primarily from the electron tunneled to the small gap QW 220 and combined with the heavy-hole in the small gap QW 220. At high injection, luminescence is provided from energy levels from both the small gap QW 220, and large gap QWs 216 and 224, hence resulting in an enhanced spectra bandwidth.

The CTCQ structure in AlGaAs/GaAs system is described with 10 nm thick structures of GaAs and $Al_{0.02}Ga_{0.98}As$ used as the small and large gap QWs, respectively. Other semiconductor alloy compositions can also be used. Alternatively, a GaAs or $Al_xGa_{1-x}As$ layer with different well widths can be used to form the small and large gap QWs. For example 12 nm thick GaAs can be used as the small gap QW 220, whereas 8 nm thick GaAs can be used as the large gap QW 216 or 224. In one embodiment, 10 nm thick $Al_{0.2}Ga_{0.8}As$ layers are used as the separating and confining quantum barrier layers 218 and 222. To satisfy the lattice match condition, either $Al_{0.5}Ga_{0.5}As$ or $Al_{0.4}Ga_{0.6}As$ or other alloy compositions (as long as they satisfy the lattice matching condition) can be used as upper and lower cladding materials.

From a theoretical calculation, a CTCQ structure can produce 850-855 nm peak luminescence at low carrier injection. At high injection, the luminescence is expected to exhibit a slight blue-shift in the peak wavelength with a broader electroluminescent bandwidth.

Figure 3:
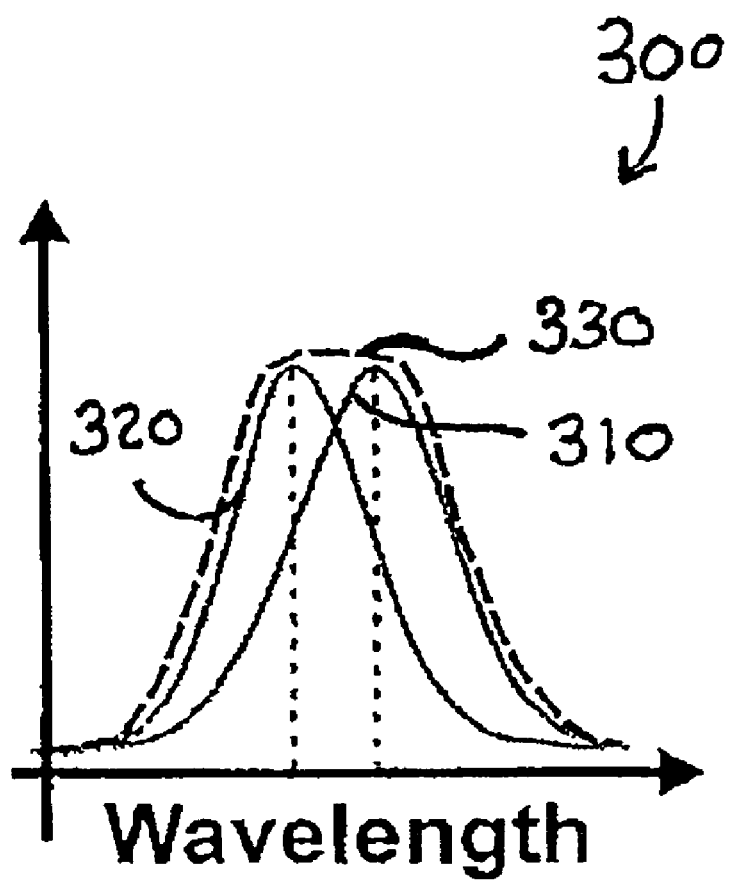
FIG. 3 illustrates an emmision spectrum for the structure of FIG. 2.

Referring to FIG. 3, a representation of the emission spectrum 300 of the structure of FIG. 2 is described. The large and small bandgap quantum wells provide photons centered about different wavelengths. That is, the larger bandgap quantum wells emit photons having a spectrum illustrated as curve 320, while the smaller quantum well emits photons having a spectrum illustrated as curve 310. The combined emissions provide a broad band spectrum 330.

The above described carrier tunneled coupled quantum-well structure 200 can be used to expand the electroluminescence spectrum of superluminescent diodes, as explained below. Some embodiments of the present invention employ a postgrowth lattice interdiffusion or intermixing process to laterally create a graded bandgap across an active gain region.

The intermixing can be achieved through nano-imprinting a gel-like dielectric layer such as a sol-gel derived $SiO_2$ layer or a spin-on-glass into multiple sections of stepped or graded vertical thickness, followed by thermal annealing. The sol-gel derived $SiO_2$ materials can be synthesized from tetraethyl orthosilicate (TEOS) commercially available from Sigma-Aldrich Corporation or spin-on-glass which is a mixture of $SiO_2$ and dopants that is suspended in a solvent solution, readily available from Honeywell International Inc. These gel-like films can be patterned by directly stamping a mold onto the sol-gel film coated substrate, followed by a heating and/or UV irradiation step to harden the thin film. In this invention, the direct stamping or imprinting technique is used as a simplified method to achieve multiple- and/or graded-bandgap QWI process described in the previous section. Broadband light source fabricated using this technique can produce higher quantum efficiency, uniform lateral carrier injection, and substantially further enhanced spectral luminescence width of the diode. The present invention can provide for a simplified quantum-well intermixing (QWI) process used to obtain lateral graded bandgap in the active semiconductor nanostructure.

Figure 4A:
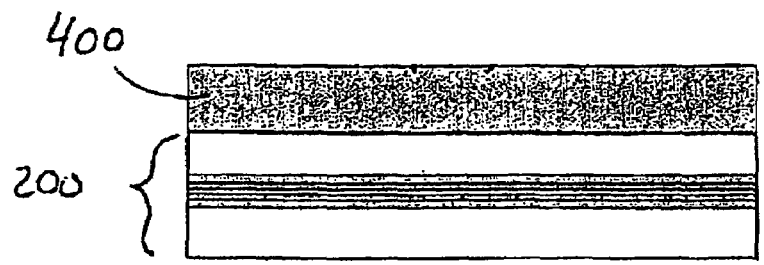
FIGS. 4A, 4B and 4C illustrate an embodiment of a nano-imprinting process.
Figure 4B:
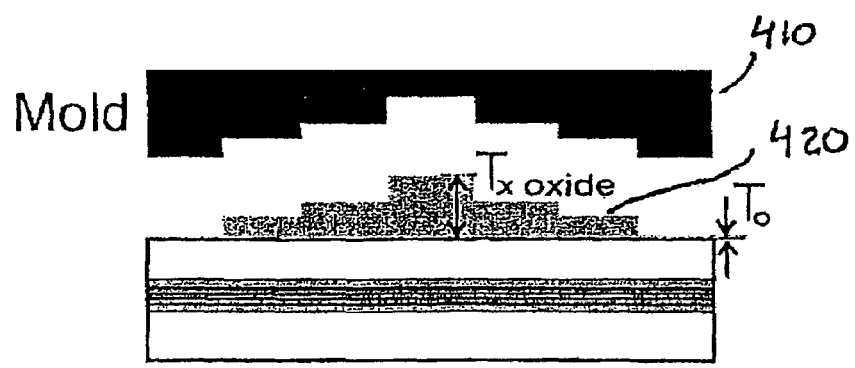
Figure 4C:
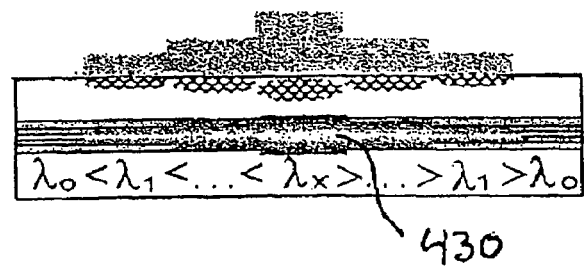

Referring to FIGS. 4A, 4B and 4C an embodiment of the nano-imprinting process is described. A sacrificial layer of the sol-gel derived $SiO_2$ layer 400 is formed on the quantum well/diode semiconductor structure 200 described above. The sol-gel derived $SiO_2$ layer in one embodiment is a spin-on material that is deposited and distributed across a semiconductor wafer using centrifugal force by spinning the wafer. The sol-gel derived $SiO_2$ layer is a relatively soft material deformable with pressure. As shown in FIG. 4B, an embossing technique using a mold 410 is applied to the sol-gel derived $SiO_2$ layer to change a profile of the layer across the diode structure. That is, the $SiO_2$ layer is formed into a step-like profile 420 of varying thickness.

After the layer is embossed, an anneal process is performed as illustrated in FIG. 4C. The sol-gel derived $SiO_2$ layer changes from a soft gel-like material to a dielectric ($SiO_2$) layer. This layer acts as a cap layer. During thermal annealing, introduced impurities or created point defects alter the Fermi level and the high temperature enhances the solubility of certain point defects, which result in an increase in atomic interdiffusion rate and promote intermixing at region 430. The graded or stepped lateral profile is used to adjust the energy levels of the laterally spaced diodes. After the anneal operation, the $SiO_2$ layer is removed (not shown), and a conductive material is formed over the diodes to fabricate conductive electrodes as explained below.

In impurity free vacancy diffusion (IFVD), it is known that the degree of intermixing is dependent on the thickness of the $SiO_2$ dielectric film. The ability to control the thickness of the $SiO_2$ IFVD cap will, in turn, control the degree of intermixing across a semiconductor wafer. Point defects, particularly Group III vacancies in GaAs/AlGaAs systems, generated by a $SiO_2$ dielectric cap is known to be an effective source to enhance the interdiffusion rate between the GaAs QWs and AlGaAs barriers during annealing. This effect results in the shift of the bottom of the quantum well upwards in the energy scale and also makes the effective width of the well narrower, although the top of the well is widened. This effect can also be applied to the valence band of the well. Both of these effects cause the band gap energy levels in the well to shift to higher energies. It has been proven to produce good processed material quality to both GaAs/AlGaAs and InGaAs/InGaAsP laser structures.

Embodiments of the present invention apply the principle of similar interdiffusion mechanism but with nano-imprinted $SiO_2$ implant mask to closely coupled multiple quantum wells, especially the CTCQ structure. Embodiments of the invention involve the creation of different $SiO_2$ mask thicknesses using the nano or sub-micron scale features of nano-imprinted sol-gel derived silica mask to act as a bandgap control mask.

For broadband semiconductor superluminescent diodes in OCT applications, an important requirement is the relative thickness of the silica intermixing mask across the multi-step or graded section(s) that defines the overall luminescence bandwidth, while a relatively small uncertainty of the central wavelength of the broad luminescence spectrum is not critical. Nano-imprinting meets this requirement. The generation of group III point vacancies is achieved using a nano-imprinted $SiO_2$ implant mask to act as a bandgap control IFVD mask. This simplified and mask-less process requires only one annealing step to produce multiple-bandgaps across a semiconductor wafer.

Multiple-bandgap and graded bandgap structures can be respectively obtained by creating a mask structure with multiple stepped and gradually graded $SiO_2$ thickness across a wafer. The embodiment process flow outlined in FIGS. 4A-4C comprises two main steps, which includes: nano-imprinting of gel-like dielectric layer such as $SiO_2$, point defect generation and diffusion using a heat treatment such as conventional oven or the rapid thermal processing (RTP). The nano-imprinting can be performed using either lithographical patterned and etched silicon substrate or using a glass plate as a mold. The ratio of the step height of the patterns and the $SiO_2$ thickness is preferably 1.5:1.0, and the preferred imprinting pressure is around 3 kg/cm$^2$ to 10 kg/cm$^2$ at room temperature.

Embodiments of the invention leverage the postgrowth bandgap engineering capability using lattice intermixing. The monolithic integration of multiple-sections of various optical functions is provided in embodiments of the invention. The multiple sections can function as a photodetector (to monitor the emitter power), a light emitting section, an amplifier (to optically amplify the output intensity), and a photon absorber (to suppression lasing action). As explained below, the present invention in some embodiments provides a reconfigurable device design scheme, particularly the application of the multiple functional electrodes and the utilization of a photon absorber to control the lasing mode and to monitor output power.

Figure 5A:
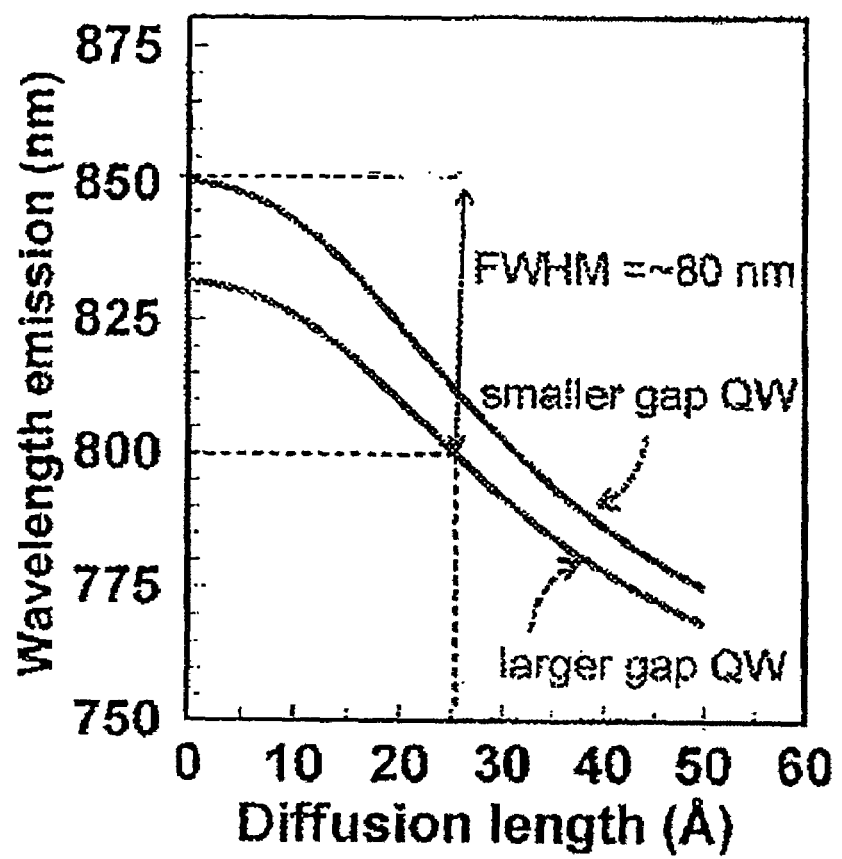
FIGS. 5A and 5B show the calculated ground state transition versus the diffusion length for CTCQ structures.

FIG. 5A illustrates a theoretical ground state transition for GaAs/AlGaAs CTCQ structures as a function of diffusion length $L_d$, thus degree of intermixing. Both small and large gap QWs are separated with a 10 nm thick $Al_{0.2}Ga_{0.8}As$ barrier. FIG. 5A shows the case of CTCQ interdiffusion with different Al content in QWs. The initial ground state emissions from the small gap QW (a 10 nm thick GaAs) and the large gap QW (a 10 nm thick $Al_{0.02}Ga_{0.98}As$) are 850 nm and 832 nm, respectively. For typical diffusion length $L_d$ of 25 Å, the ground state transitions of the small gap and the large gap QWs have been blue-shifted by 40 nm and 34 nm, respectively. From the theoretical calculation, the estimated full-width half-maximum (FWHM) of this CTCQ SLD structure is ~80 nm considering that the typical FWHM of single QW SLD is ~30 nm (~50 meV).

Figure 5B:
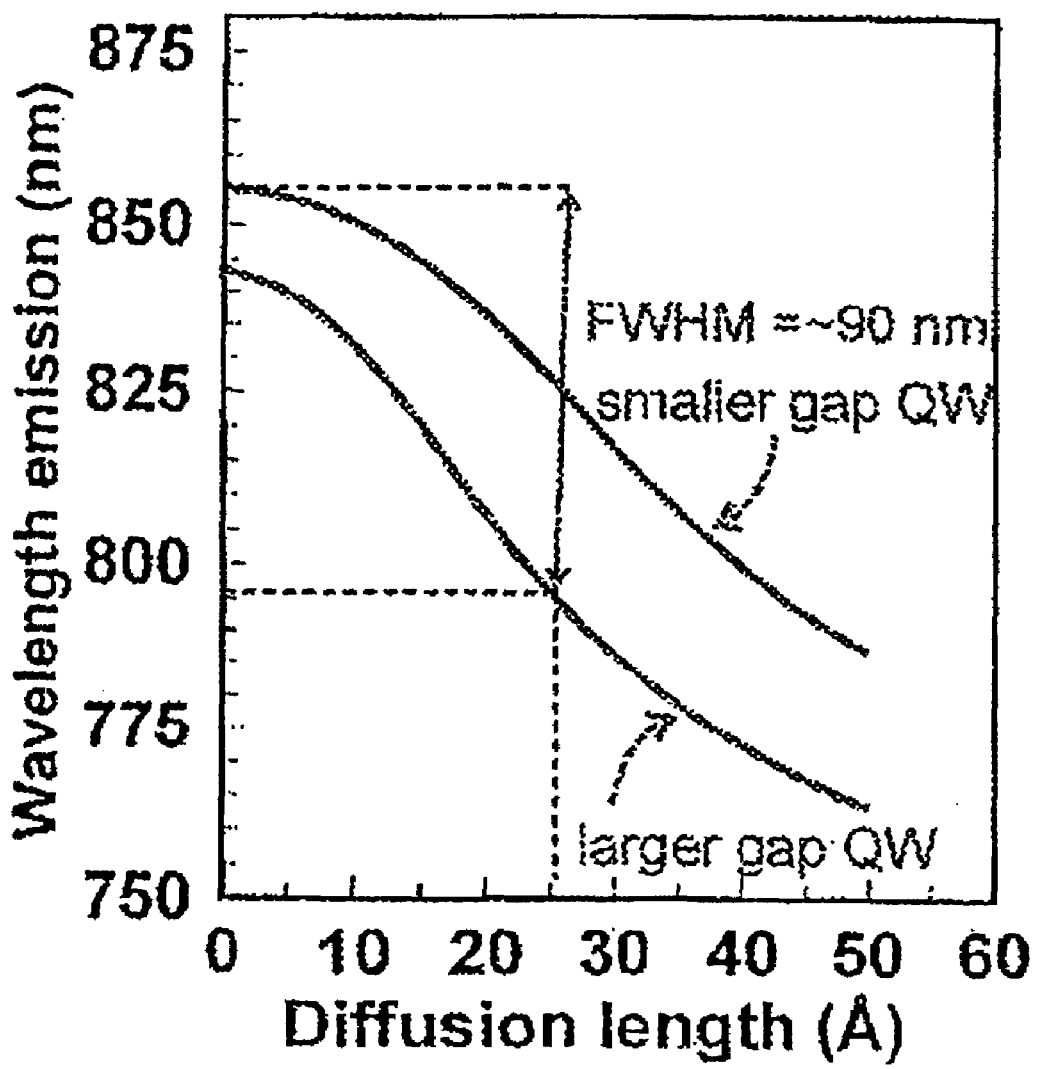

FIG. 5B illustrates a wavelength emission shift as interdiffusion proceeds in the case of CTCQ with different thicknesses of GaAs QWs. The initial ground state emissions from the small gap QW (a 12 nm thick GaAs) and the larger gap QW (a 8 nm thick GaAs) are 855 nm and 843 nm, respectively. For typical diffusion length $L_d$ of 25 Å, the ground state transitions of the small gap and the large gap QWs have been blue-shifted by 50 nm and 30 nm, respectively. This can produces a corresponding FWHM of the diode device of ~90 nm.

Wavelength and power reconfigurable semiconductor superluminescent diodes of embodiments of the invention include multiple electrodes, with different functionality, which is monolithically integrated on a semiconductor substrate. The bandgap engineered multiple QWs under these electrodes can function as a photodetector to monitor the emitter power, photon emitting sections, amplifier to optically amplify photons with energy smaller than or equal to the bandgap of the semiconductor beneath the electrode, photon absorber to suppress lasing action and as passive waveguides for photons of energy lower than the energy bandgap of the QW.

Referring again to FIG. 1, a five-section semiconductor superluminescent diode 100 is illustrated. Embodiments of the present invention are not limited to five electrodes, but the electrodes can vary from 2 to N, where N can be any reasonable integer number. The example diode structure comprises five sections; i.e., one photon absorber (PA) having electrode 160, and four diode sections ($D_1$-$D_4$) having electrodes 150, 152, 154 and 156, with bandgap energy increase of $\Delta E_5 < \Delta E_4 < \Delta E_3 < \Delta E_2 < \Delta E_1$ with respect to the bandgap energy, respectively.

Figure 13:
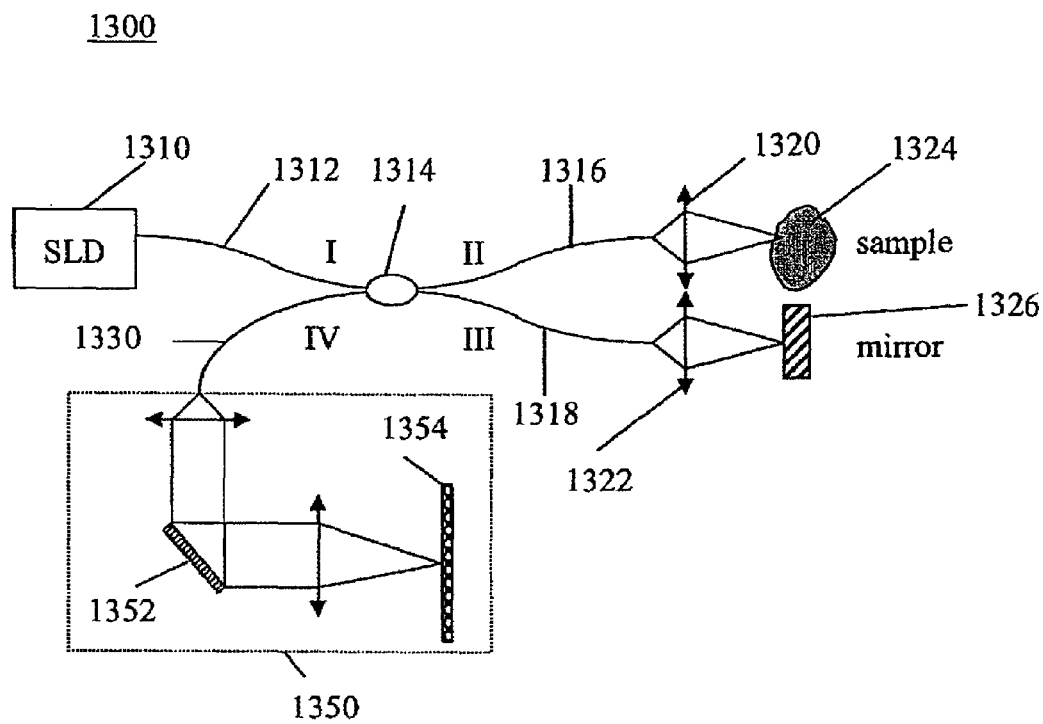
FIG. 13 illustrates a spectrometer based spectral domain optical coherence tomography system.

The photon absorber section 160 has the smallest energy bandgap. When reverse biased the photon absorber functions as a lasing suppression element by absorbing high energy photons emitted from $D_1$-$D_4$, and/or as a photodetector to monitor the output power. Reverse biasing the PA section can increase the photo-absorption efficiency via a quantum Stark effect. For the monitoring purpose, the PA section can be utilized as the photodetector that provides the information of the spontaneous emission from the device. The PA section is especially beneficial for broadband light source based optical coherence tomography (OCT) applications because it can also absorb light returned to the broadband emitter from a sample or reference arm of an OCT interferometer as shown in FIG. 13.

Most other types of broadband emitters such as standard superluminescent diodes are very sensitive to light returned to the light emitter. With the input electrical current maintained constant, the output light power from the emitter can drop substantially as a result of a small amount of light returning to the emitter. Hence in most OCT systems, there is a need for an optical isolator to be arranged between the light emitter and the OCT interferometer. The PA section of the illustrated embodiment can eliminate the optical isolator, which may have a high price tag for an optical wavelength range around 850 nm, because relatively low cost isolators are only widely available for standard optical fiber communication wavelength range around 1300 nm and 1550 nm.

It should be understood that depending on the bandwidth needed for a particular application, any number of the different sections $D_1$-$D_N$ can be selected to be reverse biased and others forward biased. In addition, it should be noted that the multiple sections can have an intermixed bandgap energy distribution that is not monotonically increasing or decreasing across the sections. For example, a short section of smaller bandgap can be made next to a relatively long section of larger bandgap or the other way round. The extent or degree of forward and reverse bias for each section of the multi-section device can be adjusted independently to not only enable a fine tuning of the emitted spectrum but also make it possible to monitor the emission strength of some sections by using, for example, neighboring section(s) as photodetector(s).

In one embodiment, diodes ($D_1$-$D_4$) are laterally bandgap graded to different degrees using the intermixing technique as discussed above. $D_1$-$D_4$ can function as either a light emitting element or a semiconductor optical amplifier (SOA) when forward biased. In addition, these diodes can also function as a passive transparent waveguide for photon emitted from diodes with smaller bandgap energy. By electrically addressing the individual diodes, the emission power can be continuously tuned, whereas the luminescence bandwidth can be tuned in steps, and the steps can be made smaller, for example, by increasing the number of sections and reducing the energy bandgap difference between two neighboring sections. As the optical feedback from the photon absorption section is negligible, a flat and low ripple spectrum can be provided.

To further expand the wavelength coverage of SLD, the integration of two or more individual CTCQ SLDs with different spectral coverage is possible using waveguide coupler(s) or other optical power combining structures (not shown) operated at the transparency condition of the coupled SLDS. An example combiner unit that can be used is disclosed in U.S. Pat. No. 6,570,659, entitled "Broadband light source system and method and light source combiner." For high power operation, however, relatively large driving current may be required.

It should be understood that the present multi-section broadband emitter can also enable a smart control of the emitted spectrum. For example, closed loop control of the source power may require independent adjustment of the drive current to each individual section, while a single feedback for the total power from the internal photo diode can be used for control with high-frequency response, the relative power between individual elements may be controlled by monitoring the spectral content, such as with the feedback from a separate spectrometer, for control with a lower frequency response.

Figure 6:
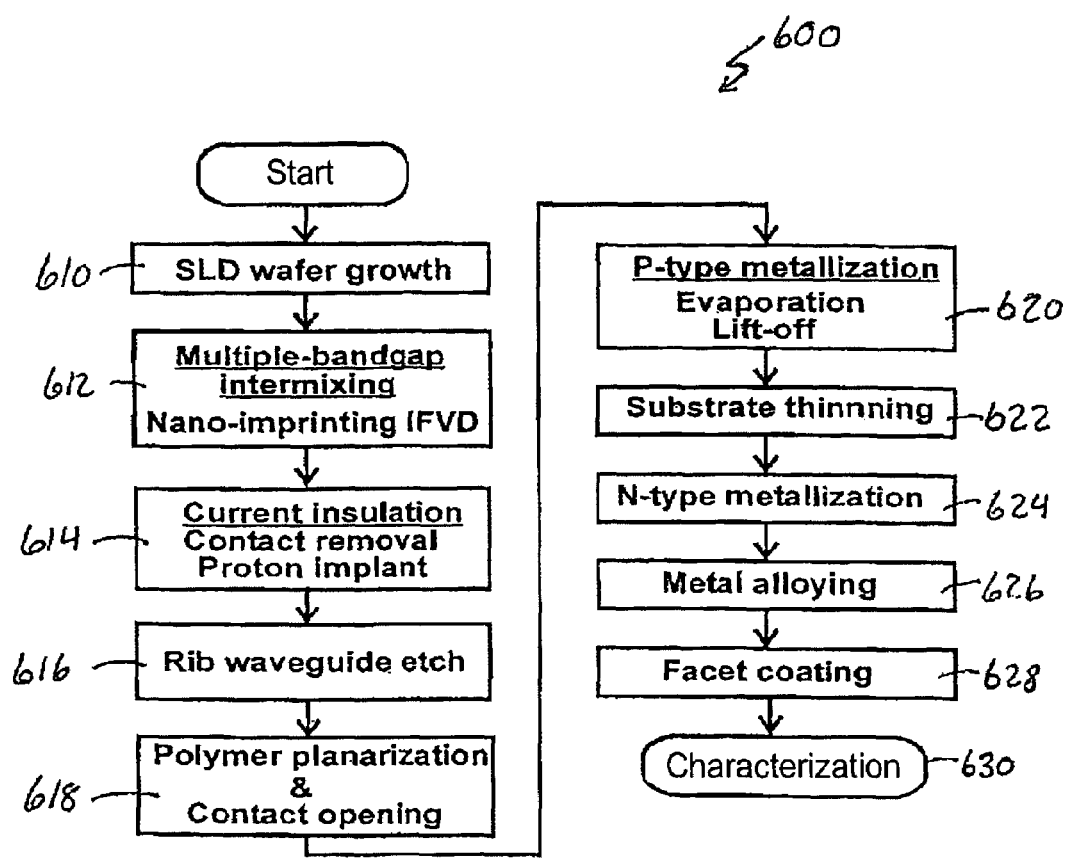
FIG. 6 illustrates a flow chart of an exemplary SLD fabrication procedure.

FIG. 6 schematically shows an illustrative fabrication flow 600 for a semiconductor superluminescent diode of the present invention. In brief, the diode structure is grown, at 610, on a GaAs (100) wafer using either molecular beam epitaxy (MBE), metal-organic chemical vapor deposition (MOCVD), or other suitable techniques.

At step 612, the sample is then coated with ~1000 nm thick of sol-gel derived $SiO_2$ layer. Next, multiple-bandgaps for each SLD section are created. For example, the nano-imprinting IFVD technique described herein is a single nano-imprinting process preformed to obtain the graded thickness $SiO_2$ across a sample. In this case, the IFVD mask is designed to give the thickest $SiO_2$ on $D_1$, and the thickness of the $SiO_2$ decreases in a step of 200 nm for $D_2$-$D_4$. To suppress quantum well intermixing, a $Si_3N_4$ mask or other IFVD suppressing dielectric layers can be deposited on the PA section during fabrication. Thermal annealing is carried out to induce the different degree of intermixing on each section.

After the intermixing process 612 and the subsequent dielectric mask removal, the wafer is further processed at step 614. In one embodiment, the samples are coated with a deposited 1.5 μm thick $SiO_2$ mask or $Si_3N_4$. After a lithography step, a dielectric etch is performed using RIE to define the pattern for a proton ($H^+$) implant mask. The highly doped GaAs contact layer is removed using a selective chemical etchant. The sample is then proton-implanted with a 100 keV energy or more at an ion angle tilted by 7° and followed by the mask removal.

At step 616, a self-aligned ridge waveguide SLD structure is achieved by etching the SLD structure using inductively coupled plasma (ICP) etching after $SiO_2$ deposition, photolithography, and RIE etching. After 200 nm thick $SiO_2$ deposition for current insulation, the wafer is then planarized at step 618 using a Dow-benzocyclobutene (BCB) Cyclotene layer. The ridge contact is opened by etching the planarized sample using an RIE etch.

After a lithography step for the electrode separation, the p-contact (Ti/Pt/Au) electrode layers are evaporated at step 620 using an electron beam evaporator. After p-contact lift-off, the substrate is thinned down at step 622 to about 100 μm thick to facilitate die cleaving and device characterizations.

Figure 14:
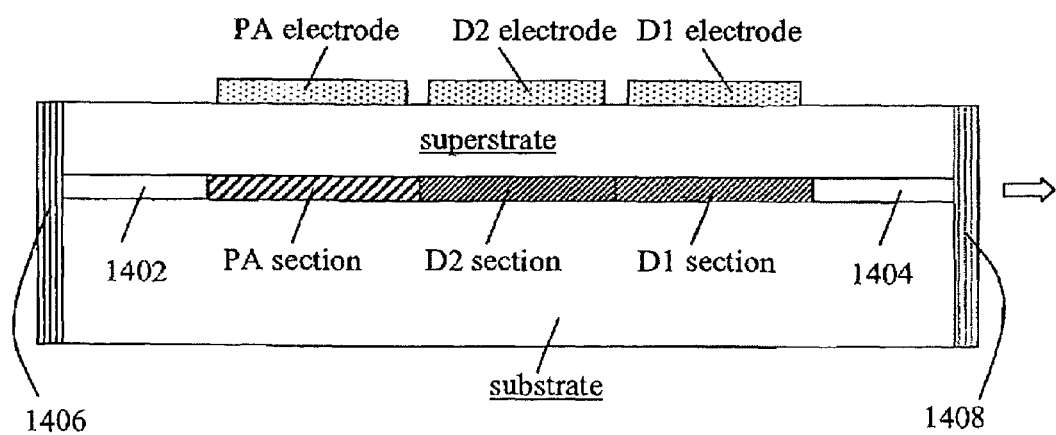
FIG. 14 illustrates a cross section view of an SLD with two transparent sections and AR coatings on the two facets

At step 624, an n-type (Au/Ge/Au/Ni/Au) contact is then evaporated on the back of the substrate. At step 626, a rapid thermal annealing is carried out to alloy the metal contacts as well as the activation of the proton implanted area. An anti-reflection (AR) coating (as shown in FIG. 14) can be added at step 628 to the front and back emitting facets of SLD bars to minimize optical feedback prior to device characterization at step 630.

It should be noted that the above fabrication steps are only one example of many possible ways to make the device. As is known to those skilled in the art, there are many other approaches as well established in semiconductor microfabrication that can be modified to suit the fabrication of the present device and the invention should not be limited by the exemplary steps.

A set of multi-electrode diode devices fabricated on a GaAs-AlGaAs closely coupled double quantum-well (DQW) emitter structure was grown by metal-organic vapor phase epitaxy (MOVPE) and was of the form of a separate-confinement heterostructure (SCH) DQW emitter. The DQW region was undoped and comprised two 10 nm wide GaAs QW's, separated by a 10 nm $Al_{0.2}Ga_{0.8}As$ barrier. The top and bottom $Al_{0.2}Ga_{0.8}As$ layers were 0.1 μm thick to complete the waveguide core. Both the upper (1.3 μm thick) and the lower (1.5 μm thick) cladding (diode doped) layers were made of $Al_{0.4}Ga_{0.6}As$ and doped to a concentration of $5\times10^{17}$ cm$^{-3}$ using carbon and silicon, respectively. The top contact epitaxial layer consisted of 0.1 μm of GaAs doped with $5\times10^{18}$ cm$^{-3}$ of zinc.

Figure 7:
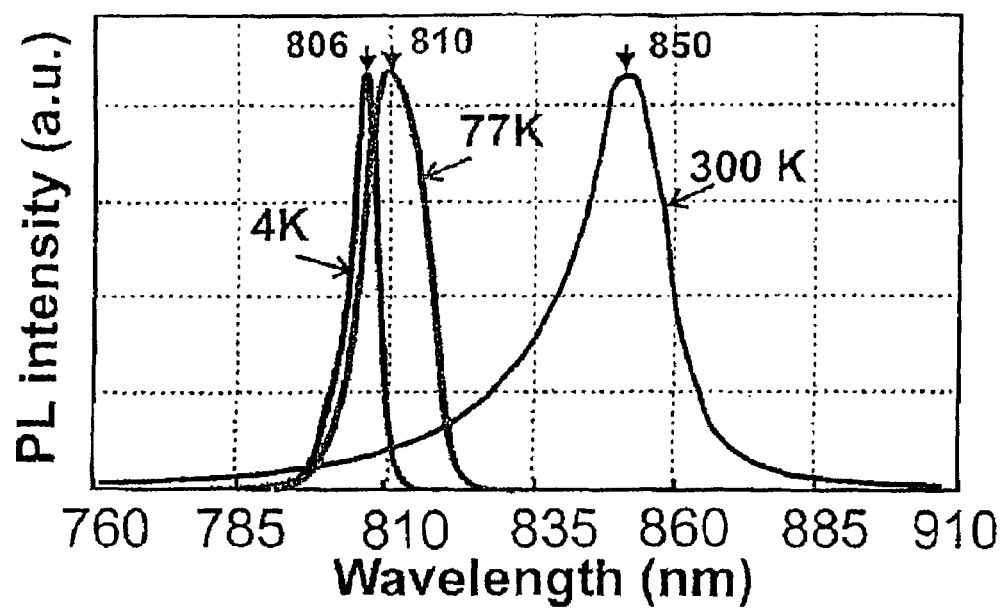
FIG. 7 shows a photoluminescence measurement of a GaAs/AlGaAs double quantum-well (DQW) laser structure.
Figure 10:
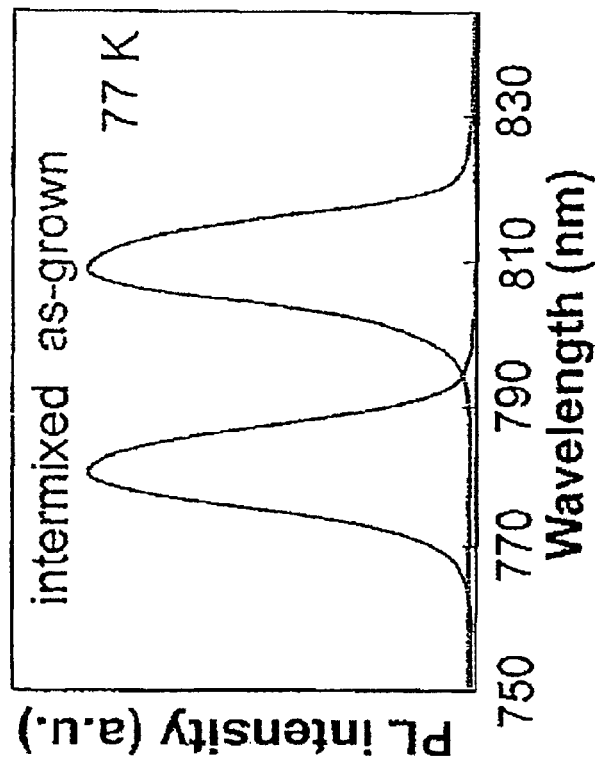
FIG. 10 illustrates the 77 K photoluminescence spectra before and after IFVD process of the structure of FIG. 7 that produces a bandgap shift of more than 30 nm.
Figure 8:
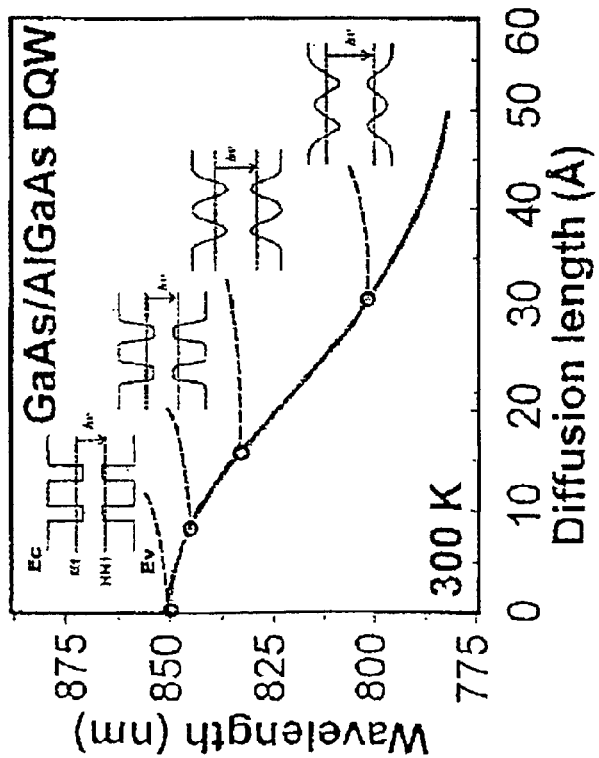
FIG. 8 illustrates a calculation of bandgap tunability and photoluminescence spectra of the same structure of FIG. 7.

As depicted in FIG. 7, this material gave a 4.2 K, 77 K, and room temperature (RT) photoluminescence (PL) peak at 806, 810, and 850 nm, respectively. From a theoretical calculation, it was found that this material system is capable of producing a wavelength tuning range of up to 60 nm for a typical inter-mixing or diffusion length of ~40 Å as shown in FIG. 8. FIG. 10 shows the 77 K photoluminescence spectra before and after IFVD process producing a bandgap shift of more than 30 nm.

Figure 9:
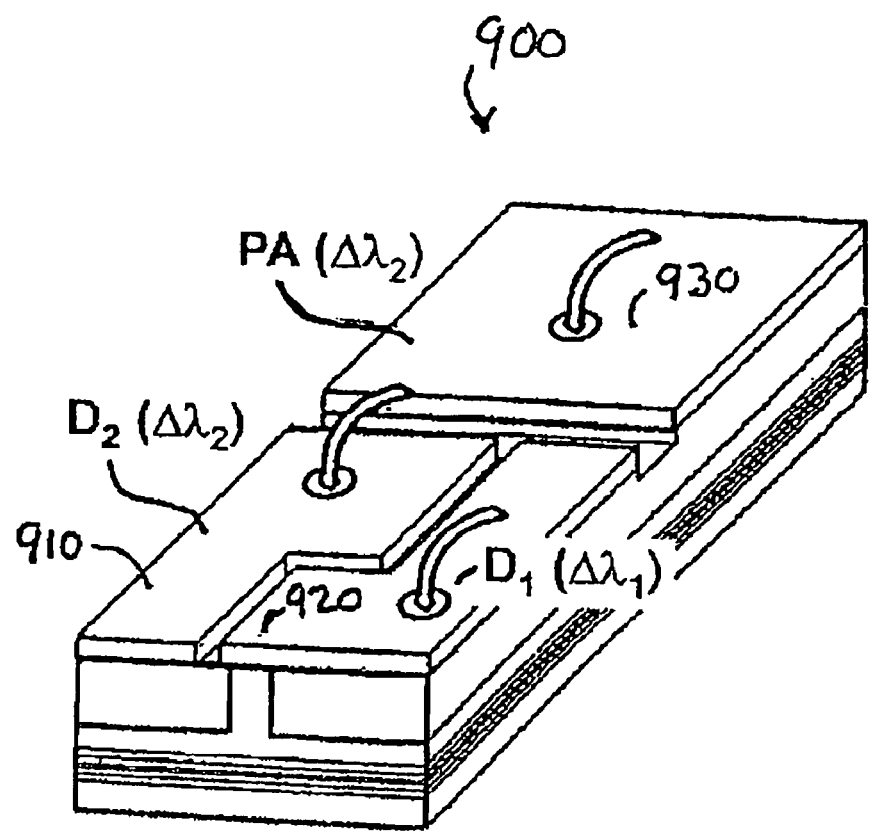
FIG. 9 illustrates a cross-section of a three section design of an SLD.
Figure 11:
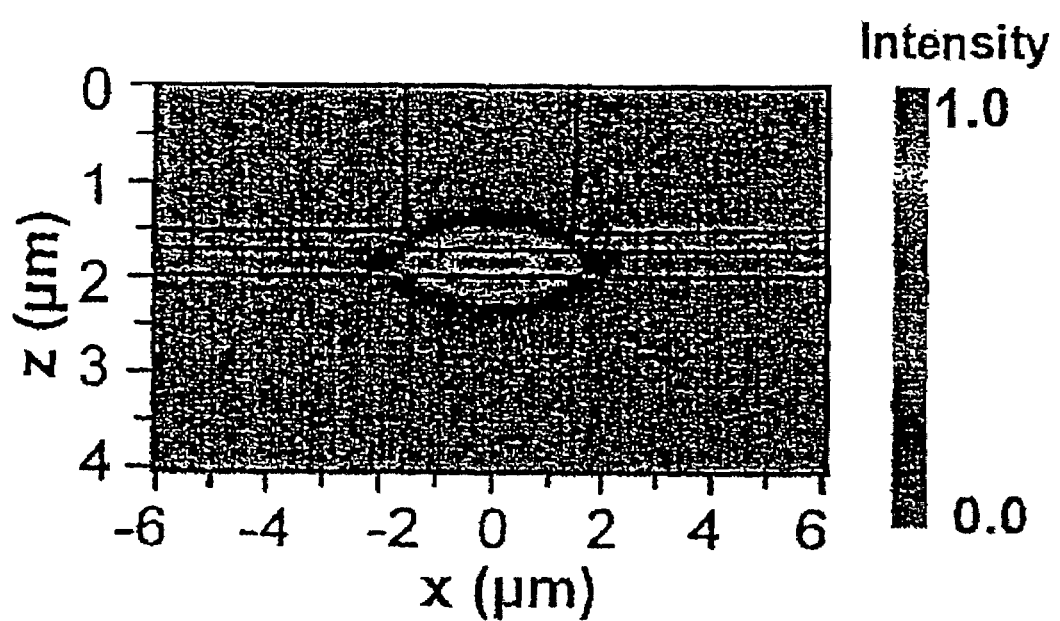
FIG. 11 is a calculated cross-sectional mode profile of FIG. 9.

Referring to FIG. 9, an alternate semiconductor superluminescent diode embodiment 900 is described which includes three sections 910, 920 and 930. Diodes D1 and D2 are both emitter sections with bandgap shift to energies $E(\Delta\lambda_1)$ and $E(\Delta\lambda_2)$, respectively. PA section 930 is the photo absorber, as well as the detector section. In this design, the waveguide for $D_1$ and $D_2$ are 4 μm wide, 1.4 μm deep, weakly guided rib waveguides. The PA is in the form of a slab-guide to increase the absorption efficiency, hence enhancing the suppression of lasing action and increasing the response of the power monitor. Various waveguide designs for the PA, include linearly tapered, parabolic and exponential expansion, have been considered and analyzed. Here, a simple slab-guide structure is implemented. As the effective refractive index of the PA section is only slightly higher than the 4 μm single mode waveguide ($n_{eff(PA)}$=3.4557, $n_{eff(rib)}$=3.4546), the interface reflection is negligibly small. This gives a negligible reflectance of $2.2\times10^{-8}$ at the interface between the rib and the slab waveguide. The mode profile of the waveguide is illustrated in FIG. 11.

Figure 12B:
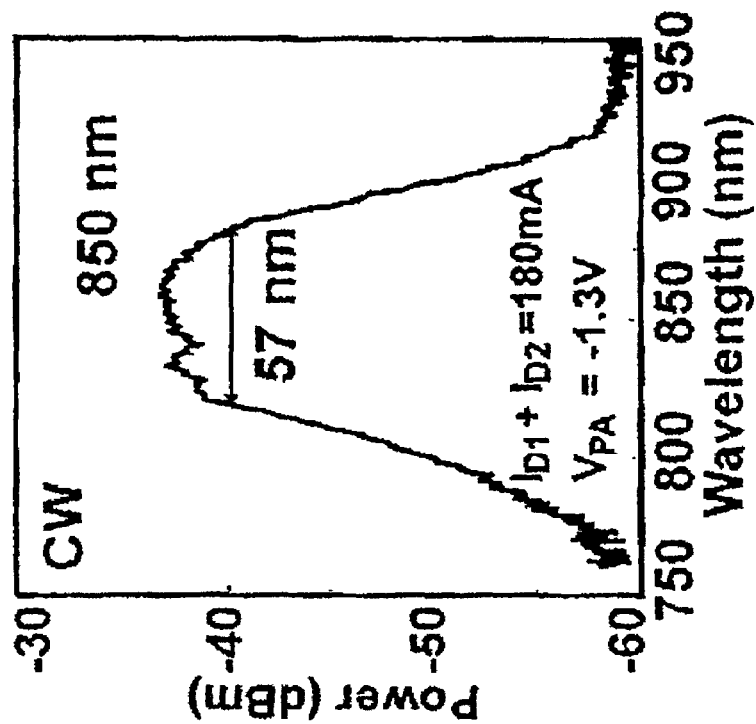
FIGS. 12A and 12B illustrate light-current-optical power characteristics measured and a broad electroluminescence.
Figure 12A:
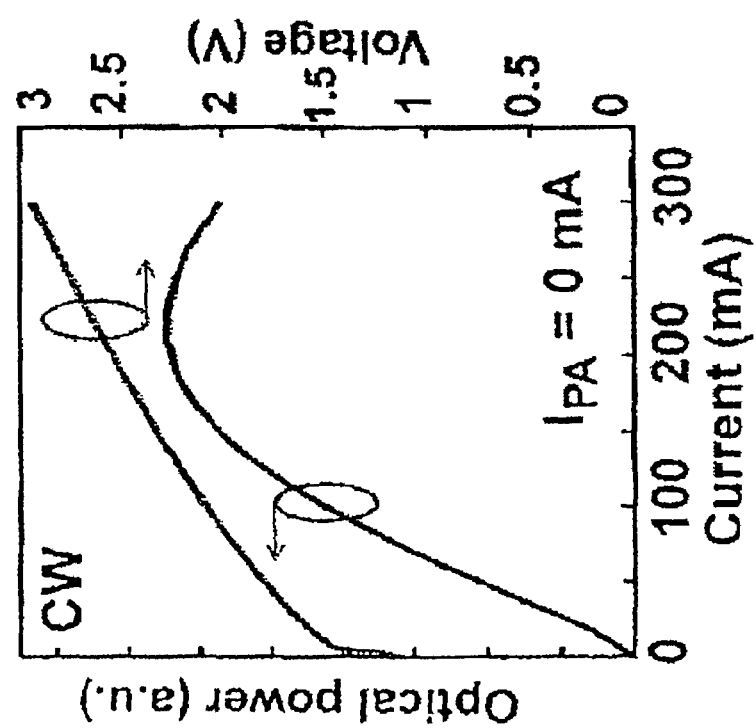

The fabricated example devices were electrically and optically characterized at room temperature under continuous wave (CW) operation. The voltage-current (V-I) and light-current (L-I) characteristics are shown in FIG. 12A. The turn-on voltage of ~1.5V has been measured from $D_1$ and $D_2$, with the PA section reverse bias to -1.3V. Using similar injection and biasing conditions, an electroluminescence curve with a spectrum width of ~60 nm and an on-chip power of ~5 mW has been measured at 180-mA pumping current (see FIG. 12B). These results were obtained from devices with emitting facet non-anti reflection coated. A spectrum modulation of better than 1 dB may be obtained from an anti-reflective coated device.

An application of embodiments of the present invention is in biological imaging. Examples include optical coherence domain ranging for distance measurement such as eye length measurement and biological tissue surface contour mapping. In terms of imaging, the device can be used as the light source for all types of optical coherence tomography (OCT), encompassing time domain and frequency domain OCT.

In particular, embodiments of the broadband emitter are useful for spectral-domain OCT (see for example, R. A. Leitgeb, et al. (2003). "Performance of fourier domain vs. time domain optical coherence tomography." *Optics Express* 11(8): 889-894.). FIG. 13 shows a spectral domain OCT system that uses a broadband emitter as described in this invention as the light source. The light wave from the broadband emitter 1310 is preferably coupled through a short length of an optical fiber 1312 to an input port (port I) of a fiber optic coupler 1314, which splits the incoming light beam into the two arms of a Michelson interferometer. The two arms each have a section of optical fiber (1316 and 1318) that guides the split light beam from the two output ports (port II and port III) of the fiber coupler 1314 to a sample 1324 and a reference reflector 1326 respectively. For both the sample arm and the reference arm, at the terminating portion of each fiber, there may be a module containing optical elements to collimate or focus or scan the beam. Illustrated in FIG. 13 as an embodiment are two focusing lenses 1320 and 1322. The returned light waves from the sample 1324 and the reference reflector 1326 are directed back through the same optical path of the sample and reference arms and are combined in fiber coupler 1314. A portion of the combined light beam is directed through a section of optical fiber 1330 from port IV of the fiber coupler 1314 to a spectrometer 1350. Inside the spectrometer, the light beam is dispersed by a grating 1352 and focused onto a detector array 1354.

FIG. 14 shows a cross sectional view of an exemplary light emitter of an embodiment of the present invention that includes two passive transparent sections 1402 and 1404, which can be created in the emitter to control the overall length of the emitter. No metal contact is defined on the passive section. To make this section transparent to emitter's photons, the passive region can be bandgap shifted to the highest possible energy using QWI process. In most conventional superluminescent diodes, in spite of anti-reflection (AR) coatings 1406 and 1408 on the two facets of the edge-emitting device as shown in FIG. 14, there are always facet reflections of light that will result in the modulation of the output spectrum because of the Fabry-Perot cavity effect. These spectral ripples can be superimposed on the emission spectrum of the emitter and can be mistakenly interpreted as a relatively strong reflection from the sample for a spectral-domain OCT and swept source OCT system.

With the present broadband emitter, in addition to the fact that the photon absorption (PA) section can substantially suppress the reflection from one of the two facets, one or more long passive transparent section(s) can be created to allow selection of an overall emitter cavity length such that its optical path length is longer than the designed optical axial scan depth of the OCT system within the sample. As a result, the spectral ripple density or frequency caused by the F-P cavity effect across the light emission spectrum can be higher than that from any reflection or scattering site within the sample and consequently, after a Fourier transform of the interferogram, the contribution from the F-P cavity induced spectral ripple is beyond the depth range of interest and hence the spectral ripple will not mistakenly lead to non-existing reflection from within the sample.

It should be understood that the presently invented device is also useful for other non-biomedical sensing and measurement applications, including fiber optic gyroscopes, optical data storage and retrieving, spectroscopy, semiconductor wafer processing monitoring, optical network fault analysis, and scientific instrumentation.

Note that the foregoing description of the invention is presented for purposes of illustration and description and is not intended to be exhaustive or to limit the invention to the precise form disclosed. Many modifications and variations are possible in light of the above teaching. The embodiments were chosen and described to best explain the principles of the invention and its practical application to thereby enable others skilled in the art to best use the invention in various embodiments and with various modifications suited to the particular use contemplated.

The invention claimed is:

1. An optical coherence tomography (OCT) system comprising:
    a light source including,
        a waveguide structure containing closely coupled multiple quantum wells on a substrate, wherein the multiple quantum wells have multiple laterally spaced sections of different bandgaps, wherein the multiple laterally spaced sections of different bandgaps are formed by a quantum-well intermixing process comprising nano-imprinting a gel-like dielectric layer over the multiple quantum wells on the waveguide surface to define the multiple laterally spaced sections of different bandgaps and thermal annealing the light source; and
        multiple electrodes each located over a corresponding one of the multiple laterally spaced sections of different bandgaps;
    an interferometer coupled to receive an output light wave from the light source; and
    a spectrometer coupled to receive at least one optical output from the interferometer.

2. The OCT system of claim 1, wherein at least one of the multiple laterally spaced bandgap sections can be selectively activated with a corresponding one of the multiple electrodes to function as a photon-absorber.

3. The OCT system of claim 1, wherein the photon-absorber eliminates a need for an optical isolator located between the light source and the interferometer.

4. The OCT system of claim 1, wherein an overall optical cavity length of the light source is greater than an optical axial scan depth of the OCT.

5. The optical coherence tomography (OCT) system as set forth in claim 1 wherein the multiple quantum wells comprises a carrier tunneled coupled quantum-well (CTCQ) structure having at least one first bandgap quantum-well coupled to at least one second larger bandgap quantum-well.

6. The optical coherence tomography (OCT) system as set forth in claim 5 wherein the first and second quantum-wells comprise different semiconductor alloy compositions.

7. The optical coherence tomography (OCT) system as set forth in claim 5 wherein the first and second quantum-wells comprise different atomic content.

8. The optical coherence tomography (OCT) system as set forth in claim 5 wherein the carrier tunneled coupled quantum-well (CTCQ) structure comprises a first quantum-well located between second and third quantum-wells, wherein the second and third quantum-wells have a higher bandgap than the first quantum-well.

9. The optical coherence tomography (OCT) system as set forth in claim 1 further comprising an anti-reflection coating on a facet of the light source.

10. An optical coherence tomography (OCT) system comprising:
    a light source including,
        a waveguide structure containing closely coupled multiple quantum wells on a substrate, wherein the multiple quantum wells have multiple laterally spaced sections of different bandgaps and each of the multiple laterally spaced sections of different bandgaps can be selectively activated with the multiple electrodes to function as either a sub-band spontaneous emitter, an optical amplifier/attenuator, a passive transparent waveguide, a photon-absorber, or a photodetector/optical power monitor; and
        multiple electrodes each located over a corresponding one of the multiple laterally spaced sections of different bandgaps;
    an interferometer coupled to receive an output light wave from the light source; and a spectrometer coupled to receive at least one optical output from the interferometer.

11. The optical coherence tomography (OCT) system as set forth in claim 10 wherein the photon-absorber is used to suppress lasing of the light source.

* * * * *